(12) United States Patent
Craig et al.

(10) Patent No.: US 6,573,620 B1
(45) Date of Patent: *Jun. 3, 2003

(54) METHOD AND APPARATUS FOR AUTOMATICALLY IDENTIFYING A CENTRAL PROCESSING UNIT

(75) Inventors: Dennis Craig, Sherwood, OR (US); James Noble, Portland, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/001,774

(22) Filed: Dec. 31, 1997

(51) Int. Cl.[7] .............................. H01L 25/00
(52) U.S. Cl. ...................... 307/147; 307/154; 307/130; 713/100
(58) Field of Search ................. 307/147, 112, 307/116, 125, 126, 149, 130, 154; 361/785, 748; 395/309, 500, 750.01, 284; 710/104; 713/1, 2, 100; 714/30, 36, 40

(56) References Cited

U.S. PATENT DOCUMENTS

| | | | | |
|---|---|---|---|---|
| 5,325,490 A | * | 6/1994 | Brasseur | 395/325 |
| 5,473,766 A | * | 12/1995 | Shaver | 395/500 |
| 5,530,887 A | * | 6/1996 | Harper et al. | 395/800 |
| 5,551,012 A | * | 8/1996 | Chuang et al. | 395/500 |
| 5,610,801 A | * | 3/1997 | Begis | 361/784 |
| 5,678,011 A | * | 10/1997 | Kim et al. | 395/282 |
| 5,734,872 A | * | 3/1998 | Kelly | 395/500 |
| 5,848,250 A | * | 12/1998 | Smith et al. | 395/309 |
| 5,987,553 A | * | 11/1999 | Swamy et al. | 710/129 |
| 6,052,794 A | * | 4/2000 | Polzin et al. | 713/500 |
| 6,066,981 A | * | 5/2000 | Craig et al. | 327/565 |
| 6,161,177 A | * | 12/2000 | Anderson | 713/2 |

OTHER PUBLICATIONS

CPIC User's Guide, Jul. 27, 1996, http://www–de.ksc.nasa.gov, Table of Contents and Sections 1 and 2.*

* cited by examiner

Primary Examiner—Fritz Fleming
(74) Attorney, Agent, or Firm—Blakely, Sokoloff, Taylor & Zafman LLP

(57) ABSTRACT

A microprocessor assembly is located on a daughterboard, which is configured to be physically and electrically coupled to a motherboard. One of the electrical terminals in an electrical connector between the daughterboard/motherboard is coupled to either a ground or a voltage supply $V_{dd}$ on the daughterboard, depending on the type of microprocessor used. The electrical connector passes either the ground or $V_{dd}$ signal to a semiconductor device on the motherboard to automatically identify the type of microprocessor on the daughterboard.

24 Claims, 1 Drawing Sheet

METHOD AND APPARATUS FOR AUTOMATICALLY IDENTIFYING A CENTRAL PROCESSING UNIT

BACKGROUND OF THE INVENTION

1. Field of the Invention

This invention relates generally to interfacing electrical components, and, more particularly, to a method and apparatus for automatically identifying the type of electrical component being interfaced.

2. Description of the Related Art

The field of electronics in general, and personal computers in particular, is evolving at a very fast pace. A personal computer includes a microprocessor, which generally dictates the power and/or speed of the personal computer. Newer and faster models of personal computers use succeeding generations of microprocessors to continually upgrade the ability of the personal computer.

While the fast-paced evolution of the microprocessor is a technical marvel, it has presented some marketing difficulties. For example, some consumers are reluctant to buy a personal computer today when the lure of faster and more powerful systems is just around the corner. Further, manufacturers of personal computers are often faced with the expensive prospect of redesigning their systems to accommodate newer generations of microprocessors. Upgradability has been offered as a solution to both problems. That is, the consumer's reluctance to buy today's personal computer may be overcome if the computer can be inexpensively and readily upgraded to keep pace with the performance of newer machines. Moreover, upgradability necessarily means that a substantial portion of the personal computer need not be entirely redesigned with each new generation of microprocessor.

For upgradability to be economically viable, it is desirable that the number of items needed to be upgraded be kept at a minimum. Moreover, the upgrade process needs to be simple and relatively fool proof. Personal computer manufacturers have designed in some upgradability through the use of manually selectable jumpers. Manually selectable jumpers are problematic in that they leave open the possibility that improper installation will occur at the time that the upgrade is attempted. Mislocated jumpers will, at best, cause poor performance or inoperability, and may even damage the personal computer.

The present invention is directed to overcoming, or at least reducing the effects of, one or more of the problems set forth above.

SUMMARY OF INVENTION

In one aspect of the present invention, an apparatus includes a motherboard and a daughterboard. A semiconductor device is mounted on the motherboard and has a configuration input terminal and an output terminal. The semiconductor device delivers a first and second signal on the output terminal in response to receiving a first and second signal on the configuration input terminal, respectively. A first electrical connector is mounted on the motherboard and has a first terminal coupled to the configuration input terminal of the semiconductor device. The daughterboard has a second electrical connector mounted thereon and also has a first and second terminal. The second electrical connector is mateable with the first electrical connector to electrically engage the first and second terminals of the first and second electrical connectors. The first terminal of the second electrical connector is adapted to be connected to one of a first and second voltage supply to generate one of the first and second signals on the configuration input terminal of the semiconductor device in response to the first and second electrical connectors being mated together.

In another aspect of the instant invention, a method is provided for controlling a semiconductor device on a motherboard to deliver one of a first and second output signal to a daughterboard. The semiconductor device has a control input and an output terminal coupled to a first and second terminal, respectively, of a first electrical connector on the motherboard. The method includes coupling a first voltage supply terminal to a corresponding first terminal of a second electrical connector on the daughterboard in response to a first type of circuit being located on the daughterboard. A second voltage supply terminal is coupled to the first terminal of the second electrical connector on the daughterboard in response to a second type of circuit being located on the daughterboard. An input terminal of a circuit mounted on the daughterboard is coupled to the second terminal of the second electrical connector.

BRIEF DESCRIPTION OF THE DRAWINGS

Other objects and advantages of the invention will become apparent upon reading the following detailed description and upon reference to the drawings in which.

Figure 2:
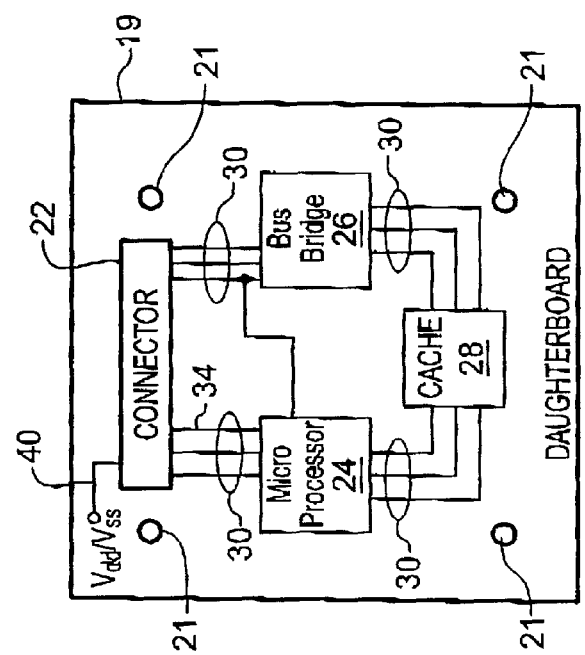
FIG. 2 illustrates a diagrammatic side view of one embodiment of the motherboard/daughterboard assembly of FIG. 1.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below as it might be employed in controlling a semiconductor device on a motherboard to deliver one of a first and second output signal to a daughterboard. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
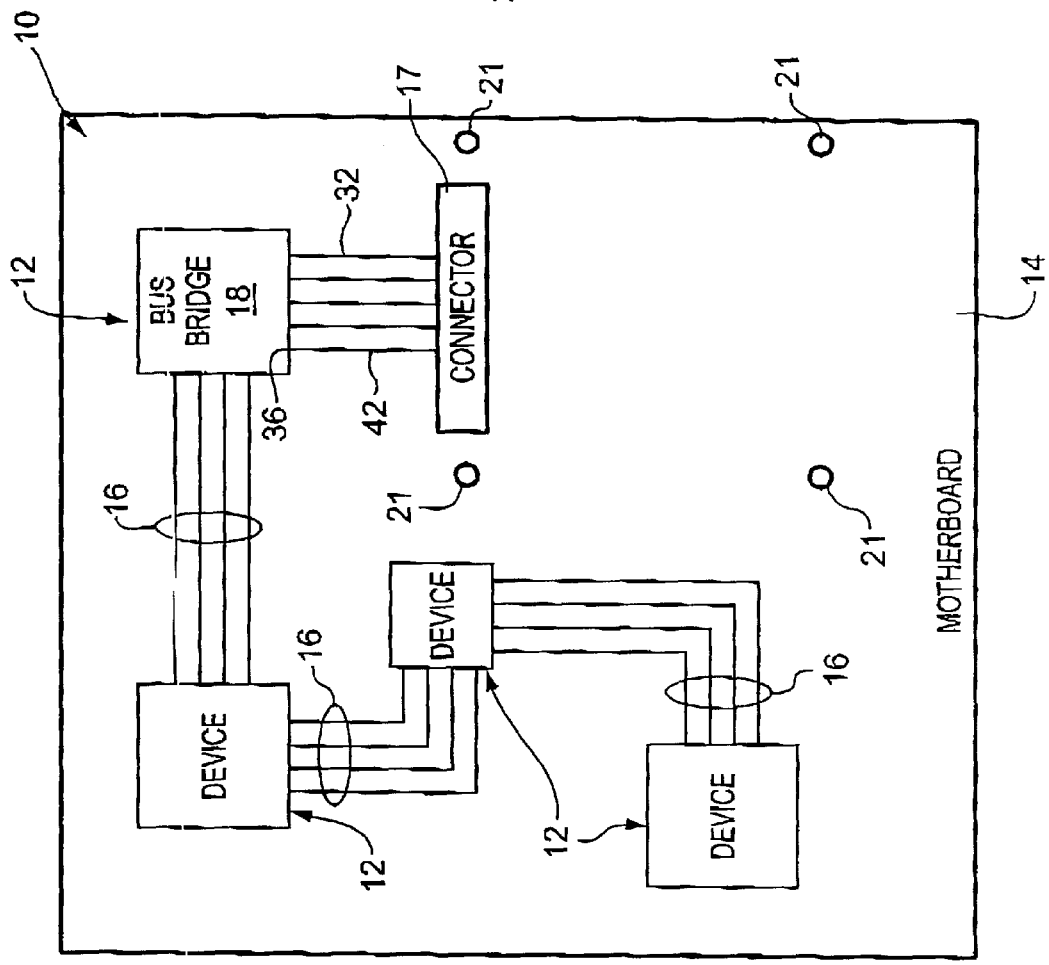
FIG. 1 illustrates a diagrammatic view of a motherboard/daughterboard assembly according to one aspect of the present invention.

Turning now to the drawings, and in particular to FIG. 1, a printed circuit board, such as a motherboard 10, is shown with a variety of semiconductor devices 12 deployed on its surface 14. Various terminals of the semiconductor devices 12 and bus bridge 18 providing inputs, outputs, power and ground are electrically coupled together by a plurality of conductive traces 16. A conventional electrical connector 17 containing at least one conductive terminal is also deployed on the surface 14 of the motherboard 10, and is electrically coupled to at least one of the semiconductor devices 12, or bus bridge 18. In one embodiment of the present invention, the bus bridge 18 is a Southbridge portion of a PCI chipset manufactured by Intel as part number PIIX4.

Referring now to FIG. 2, a separate, usually smaller, printed circuit board, such as a daughterboard 19, is shown removably coupled to the motherboard 10 by mechanical fixtures, such as screws (not shown), extending through openings 21 in the motherboard 10 and daughterboard 19. The daughterboard 19 is also electrically coupled to the motherboard 10 by a conventional electrical connector 22 containing at least one conductive terminal that mates with the electrical connector 17 of the motherboard, either directly of through an intermediate cable (not shown).

The daughterboard 19 is similar in construction and function to that of the motherboard 10. That is, the daughterboard 19 is a printed circuit board with semiconductor devices, such as a microprocessor 24, a bus bridge 26, and a cache 28, positioned thereon, each with various terminals providing inputs, outputs, power, and ground, and interconnected by electrical traces 30. In one embodiment of the present invention, the microprocessor 24 is a Pentium® microprocessor, and the bus bridge 26 is a Northbridge portion of a PCI chipset manufactured by Intel as part number 430TX. In another embodiment of the instant invention, the microprocessor 24 is a Pentium II® microprocessor, and the bus bridge 26 is a Northbridge portion of a PCI chipset manufactured by Intel as part number 440BX. Upgrading a personal computer that employs the motherboard 10 of the instant invention involves the relatively straightforward operation of replacing the daughterboard 19.

The PIIX4 bus bridge 18 must operate in a different manner when coupled to the PENTIUM® and PENTIUM II® microprocessors 24. In particular, the PIIX4 bus bridge 18 provides an INIT signal to both types of the microprocessor 24, but the proper value of the INIT signal is different for each type of the microprocessors 24. The PIIX4 bus bridge 18 is placed in the proper mode of operation by a signal on its CONFIG1 pin 36. For example, a logically high CONFIG1 signal indicates that the PIIX4 bus bridge 18 is to be operated in conjunction with a PENTIUM PRO® microprocessor 24. Alternatively, a logically low CONFIG1 signal indicates that the PIIX4 bus bridge 18 is to be operated in conjunction with a PENTIUM microprocessor 24.

In the first embodiment of the daughterboard 19, the PENTIUM microprocessor 24 uses the INIT signal generated by the PIIX4 bus bridge 18 on the motherboard 10. The INIT signal generated by the PIIX4 bus bridge 18 is communicated over a trace 32 on the motherboard 10, through the electrical connectors 17, 22, and over a trace 34 on the daughterboard 19 to the PENTIUM microprocessor 24.

In the second embodiment of the daughterboard 19, the PENTIUM PRO microprocessor 24 uses an INIT signal generated by the PIIX4 bus bridge 18 on the motherboard 10. The INIT signal generated by the PIIX4 bus bridge 18 is communicated over the trace 32 on the motherboard 10, through the electrical connectors 17, 22, and over the trace 34 on the daughterboard 19 to the PENTIUM PRO microprocessor 24. In other words, both embodiments use the same PIIX4 bus bridge 18, the same traces 32, 34, and the same electrical connectors 17, 22, but each embodiment requires a different INIT signal be delivered over these same connections.

In the first embodiment of the daughterboard 19, a trace 40 on the daughterboard 19 is coupled to a voltage supply $V_{dd}$ to place a logically high signal thereon. The trace 40 is also coupled to the connector 22, and, in turn, to the connector 17 on the motherboard 10. A trace 42 is coupled between a CONFIG1 pin 36 and the connector 17, such that the logically high signal on the trace 40 is communicated to the PIIX4 bus bridge 18. The PIIX4 bus bridge 18 responds to the logically high signal on the CONFIG1 pin 36 by producing the INIT signal required by the PENTIUM microprocessor 24.

In the second embodiment of the daughterboard 19, the trace 40 on the daughterboard 19 is coupled to a ground voltage supply $V_{SS}$ to place a logically low signal thereon. The trace 40 is also coupled to the connector 22, and, in turn, to the trace 42 on the motherboard 10. The trace 42 communicates the logically low signal to the CONFIG1 pin 36, such that the PIIX4 bus bridge 18 produces the INIT signal required by the PREMIUM II microprocessor 24.

Thus, the present invention provides for an automatic selection of the appropriate INIT signal during a manual upgrade operation. This automatic selection is accomplished without the need for intervention by the installer, preventing the wrong INIT signal from being delivered to the daughterboard 19. Installation of the daughterboard 19 automatically couples the appropriate CONFIG1 signal to the bus bridge 18.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus, comprising:
   a motherboard, including:
      a bus bridge mounted on the motherboard, the bus bridge having a configuration input terminal and an output terminal, the bus bridge generating a first and second initialization signal on the output terminal in response to receiving a first and second configuration signal on said configuration input terminal, respectively; and a first electrical connector mounted on said motherboard, the first electrical connector having a first and second terminal, said first terminal being coupled to the configuration input terminal of said bus bridge; and
   a daughterboard including a processor mounted on the daughterboard, the processor having a second electrical connector mounted on the daughterboard and having a first and second terminal, said second electrical connector being mateable with said first electrical connector to electrically engage the first and second terminals of the first and second electrical connectors, said first terminal of said second electrical connector being adapted to be connected to one of a first and second voltage supply to generate one of the first and second configuration signals on the configuration input terminal of said semiconductor device in response to the first and second electrical connectors being mated together.

2. An apparatus, as set forth in claim 1, wherein:
the second terminal of the first electrical connector is coupled to the output of said bus bridge, and said second electrical connector has a second terminal electrically engageable with the second terminal of said first electrical connector; and
the processor on said daughterboard has an input terminal coupled to the second terminal of said second electrical connector.

3. An apparatus, as set forth in claim 2, wherein the first terminal on said daughterboard is adapted to be coupled to the first voltage supply in response to said processor being a first type of processor, and the first terminal on said daughterboard is adapted to be coupled to the second voltage supply in response to said processor being a second type of processor.

4. The apparatus of claim 1, wherein the bus bridge comprises a Southbridge portion of a PCI chipset.

5. A daughterboard adapted to be coupled to a motherboard. via a first electrical connector, wherein the motherboard includes a bus bridge to generate a first and second initialization signal in response to receiving a first and second configuration signal on an input terminal via said electrical connector, said daughterboard comprising:
a second electrical connector mounted thereon and having a first terminal, said second electrical connector being mateable with said first electrical connector to electrically engage the first terminal of the second electrical connector with the input terminal of said bus bridge, said first terminal of said second electrical connector being adapted to be connected to one of a first and second voltage supply to generate one of the first and second configuration signals on the input terminal of said bus bridge in response to the first and second electrical connectors being mated together.

6. A daughterboard, as set forth in claim 5, wherein the output signal is coupled to the first electrical connector, and said daughterboard includes:
the second electrical connector having a second terminal coupled to receive the output signal; and
a processor mounted on said daughterboard and having an input terminal coupled to the second terminal of said second electrical connector.

7. A daughterboard, as set forth in claim 6, wherein the first terminal is adapted to be coupled to the first voltage supply in response to said processor being a first type of processor, and the first terminal is adapted to be coupled to the second voltage supply in response to said processor being a second type of processor.

8. A method for controlling a bus bridge on a motherboard to generate one of a first and second output initialization signal, wherein the bus bridge has a control input and an output terminal coupled to a first and second terminal, respectively, of a first electrical connector on said motherboard, comprising:
coupling a first voltage supply terminal to a corresponding first terminal of a second electrical connector on a daughterboard in response to a first type of processor being located on said daughterboard;
coupling a second voltage supply terminal to the first terminal of the second electrical connector on the daughterboard in response to a second type of processor being located on said daughterboard; and
coupling an input terminal of a processor mounted on said daughterboard to the second terminal of the second electrical connector.

9. A method, as set forth in claim 8, wherein the coupling of the first terminal of the second electrical connector to the first voltage supply or to the second voltage supply occurs upon the mating of the first electrical connector to the second electrical connector.

10. An apparatus, comprising:
a motherboard, including:
a bus bridge mounted on the motherboard and having a configuration input terminal and an initialization output terminal, the bus bridge generating a first initialization signal on the initialization output terminal in response to receiving a first configuration signal on the configuration input terminal and generating a second initialization signal on the initialization output terminal in response to receiving a second configuration signal on the configuration input terminal, and
a first electrical connector mounted on said motherboard and having a first terminal and a second terminal, said first terminal being coupled to the configuration input terminal of the bus bridge and the second terminal being coupled to the initialization output terminal of the semiconductor device; and
a daughterboard, including:
a processor mounted on the daughterboard, and a second electrical connector mounted on the daughterboard and having a first terminal and a second terminal, the second electrical connector being mateable with the first electrical connector to electrically engage the first and second terminals of the first and second electrical connectors, the first terminal of the second electrical connector being adapted to be connected to one of a first and second voltage supply to generate one of the first and second configuration signals, respectively, on the configuration input terminal of said bus bridge in response to the first and second electrical connectors being mated together, the first configuration signal generated in response to the processor being a first type of processor and the second configuration signal generated in response to the processor being a second type of processor.

11. An apparatus, as set forth in claim 10, wherein the circuit mounted on the daughterboard is a central processing unit.

12. A method comprising:
placing a bus bridge mounted on a motherboard in a first mode of operation and causing the bus bridge to generate a first processor initialization signal by coupling a first voltage supply on a daughterboard to an input configuration terminal of the bus bridge in response to a first type of processor being located on the daughterboard; and
placing the bus bridge in a second mode of operation and causing the bus bridge to generate a second processor initialization signal by coupling a second voltage supply on the daughterboard to the input configuration terminal of the bus bridge in response to a second type of processor being located on the daughterboard.

13. A method, as set forth in claim 12, wherein the first voltage supply and second voltage supply are present on the daughterboard when the motherboard is coupled with the daughterboard.

14. A daughterboard configured to be coupled to a motherboard, the daughterboard comprising:
a processor mounted on the daughterboard; and
an electrical connector mounted on the daughterboard, the electrical connector including a first terminal that is adapted to be connected to a first voltage supply in response to the processor being a first type of processor or a second voltage supply in response to the processor being a second type of processor to configure a bus bridge mounted to the motherboard to operate in accordance with a first mode of operation or a second mode of operation, respectively, and cause the bus bridge to generate a first initialization signal or a second initialization signal.

15. An apparatus, as set forth in claim 14, wherein the electrical connector mounted on the daughterboard is mateable with a second electrical connector that is present on the motherboard.

16. A method for automatically identifying the type of electrical circuit that is present on a daughterboard when the daughterboard is coupled to a motherboard, comprising:

producing a configuration signal from the daughterboard by coupling one of two voltage supply terminals to each terminal of a set of one or more configuration terminals on the daughterboard and connecting the set of configuration terminals to a first electrical connector on the daughterboard;

connecting a set of one or more input terminals of a bus bridge present on the motherboard to a second electrical connector;

coupling the first electrical connector to the second electrical connector such that the configuration terminals of the daughterboard are electrically connected to the input terminals of the bus bridge and the configuration signal is delivered to the bus bridge through the set of input terminals;

producing an initialization signal from the bus bridge that is responsive to the configuration signal and is appropriate for the type of electrical circuit present on the daughterboard;

coupling a set of one or more output terminals of bus bridge to the second electrical connector and delivering the initialization signal produced by the bus bridge through the set of output terminals; and coupling a set of one or more initialization terminals on the daughterboard to the first electrical connector such that when the first and second electrical connectors are coupled together the initialization terminals are electrically connected to the set of output terminals on the second electrical connector and the initialization signal is delivered to the daughterboard.

17. A method, as set forth in claim 16, wherein the electrical circuit present on the daughterboard is a central processing unit.

18. An apparatus comprising: a motherboard having a bus bridge mounted thereon to generate an output signal of either a first initialization signal or a second initialization signal onto an output terminal in response to receiving a control signal input to said motherboard; and a daughterboard coupled to said motherboard and having a processor mounted thereon, the processor utilizing the output signal for its operation and in which said daughterboard generates the control signal to select the first or second initialization signal from the bus bridge.

19. The apparatus of claim 18, further including a first connector disposed on said motherboard and a second connector disposed on said daughterboard, said connectors engaged to couple the output signal and the control signal from one board to the other.

20. The apparatus of claim 19, wherein the control signal has two states and a selected state of the control signal is determined by an initialization signal desired for operation of the processor.

21. A daughterboard for coupling to a motherboard comprising:

a processor mounted thereon, in which said processor operates using an initialization signal;

a configuration signal to identify the particular initialization signal required by said processor;

a connector mounted thereon for mating to a corresponding connector on the motherboard, said configuration signal coupled through said connectors to a bus bridge on the motherboard to select one of a plurality of initialization signals to be generated by the bus bridge, said connectors coupling the initialization signal to said processor for its operation.

22. The daughterboard of claim 21, wherein the bus bridge on the motherboard generates one of the plurality of initialization signals, in which a state of said configuration signal determines which of the plurality of initialization signals is received by said processor.

23. The daughterboard of claim 22, wherein more than one type of processor is operable on said daughterboard, in which the types are differentiated by the initialization signal required.

24. An apparatus comprising:

a motherboard, including:

a Southbridge portion of a PCI chip set mounted on the motherboard, the Southbridge portion delivering a first and second initialization signal on the output terminal in response to receiving a first and second configuration signal on said configuration input terminal, respectively; and a first electrical connector mounted on said motherboard, the first electrical connector having a first and second terminal, said first terminal being coupled to the configuration input terminal of said Southbridge potion; and a daughterboard including a Northbridge portion of a PCI chip set mounted on the daughterboard, the Northbridge portion having a second electrical connector mounted on the daughterboard and having a first and second terminal, said second electrical connector being mateable with said first electrical connector to electrically engage the first and second terminals of the first and second electrical connectors, said first terminal of said second electrical connector being adapted to be connected to one of a first and second voltage supply to generate one of the first and second configuration signals on the configuration input terminal of said semiconductor device in response to the first and second electrical connectors being mated together.

* * * * *